United States Patent
Ryan

(10) Patent No.: US 8,760,325 B2
(45) Date of Patent: Jun. 24, 2014

(54) SCHEME FOR BALANCING SKEW BETWEEN LANES OF HIGH-SPEED SERIAL DIGITAL INTERFACE

(71) Applicant: Ivan R Ryan, Limerick (IE)

(72) Inventor: Ivan R Ryan, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/685,910

(22) Filed: Nov. 27, 2012

(65) Prior Publication Data

US 2013/0249719 A1    Sep. 26, 2013

Related U.S. Application Data

(60) Provisional application No. 61/614,647, filed on Mar. 23, 2012.

(51) Int. Cl.
*H03M 7/00* (2006.01)

(52) U.S. Cl.
USPC ............................................. 341/61; 341/155

(58) Field of Classification Search
USPC ..................................................... 341/61, 155
See application file for complete search history.

(56) References Cited

U.S. PATENT DOCUMENTS

| | | | |
|---|---|---|---|
| 6,057,789 A * | 5/2000 | Lin ................................. | 341/61 |
| 6,359,479 B1 * | 3/2002 | Oprescu ........................ | 327/141 |
| 6,904,537 B1 * | 6/2005 | Gorman ........................ | 713/401 |
| 7,339,503 B1 * | 3/2008 | Elenes et al. .................... | 341/61 |
| 7,571,338 B2 * | 8/2009 | Osterling et al. ............. | 713/500 |
| 8,421,656 B2 * | 4/2013 | Nishi ............................ | 341/118 |

* cited by examiner

*Primary Examiner* — Khai M Nguyen
(74) *Attorney, Agent, or Firm* — Kenyon & Kenyon, LLP

(57) ABSTRACT

A device that supports communication over parallel serial lanes may include an analog circuit domain, a digital circuit domain, a buffer between the analog domain and the digital domain, and an alignment circuit. The buffer may receive data from the digital domain according to a write clock and send out the received data to the analog domain according to a read clock. The alignment circuit may generate control signals to initiate reading from the buffer when the read clock and write clocks are aligned. In one embodiment, the device may be an analog-to-digital converter (ADC) integrated circuit (IC) chip and the buffer may be a FIFO.

20 Claims, 6 Drawing Sheets

100

200

500

600

700

SCHEME FOR BALANCING SKEW BETWEEN LANES OF HIGH-SPEED SERIAL DIGITAL INTERFACE

CROSS-REFERENCE TO RELATED APPLICATION

The present disclosure benefits from priority of U.S. patent application 61/614,647, entitled "Scheme for Balancing Skew Between Lanes of High-Speed Serial Digital Interface," filed Mar. 23, 2012, the disclosure of which is incorporated herein in its entirety.

BACKGROUND

JEDEC has released a series of industry standards for interconnection between a digital-to-analog converter (DAC) or an analog-to-digital converter (ADC) and logic devices using serial data lanes. Some of these industry standards, for example, the JESD204B serial interface specification, support multiple data lanes in parallel (e.g., 4 lanes between an ADC and a logic device) but require that the skew between serial lanes be kept within specified tolerances.

In an ADC or DAC integrated circuit (IC) chip, for most digital blocks, latency is consistent due to the nature of digital processing. However, a first in first out (FIFO) buffer typically is used at the end of a data path for the digital blocks to transfer a bitstream from a digital clock domain to a high frequency analog serial clock domain. The design of the FIFO is complicated due to the high frequency nature of the encoding scheme and high-speed nature of the serial link. For example, the JESD204B serial interface uses an "8b10b" encoding scheme that converts an 8-bit value into a 10-bit code, with some redundancy for control codes. Under this encoding scheme, a framer circuit, which creates properly encoded frames, produces a multiple number of 10-bit codes per write clock period. At the other side of the buffer, it is possible to design a serializer that could handle input-output ratios that are not a power of two (2). However, this is more complex than the power of 2 version and more difficult to achieve the required speed. Thus, high speed analog circuits that serialize the bitstream typically operate on a power of 2 basis. For example, the analog circuit of a two-channel 16-bit ADC reads 32 bits from a FIFO per read clock period while the digital domain writes 40 bits per write clock period. Thus, the read and write clocks for the FIFO are at different frequencies and have no defined phase relationship. This asynchronous nature of the write and read clocks to the FIFO causes the FIFO to have an inconsistent latency. In worst-case scenarios, this could lead to a variation in latency by up to one clock period. This would exceed the skew allowances in the specification.

Therefore, the inventor perceives a need in the art for an ADC or DAC chip with an alignment system that ensures a low variation in latency through parallel FIFOs.

DETAILED DESCRIPTION

Embodiments of the present invention provide a device that supports communication over parallel serial lanes. The device may comprise an analog circuit domain, a digital circuit domain, a buffer between the analog domain and the digital domain, and an alignment circuit. The buffer may receive data from the digital domain according to a write clock and send out the received data to the analog domain according to a read clock. The alignment circuit may generate control signals to initiate reading from the buffer when the read clock and write clocks are aligned. In one embodiment, the device may be an analog-to-digital converter (ADC) integrated circuit (IC) chip and the buffer may be a FIFO.

Figure 1:
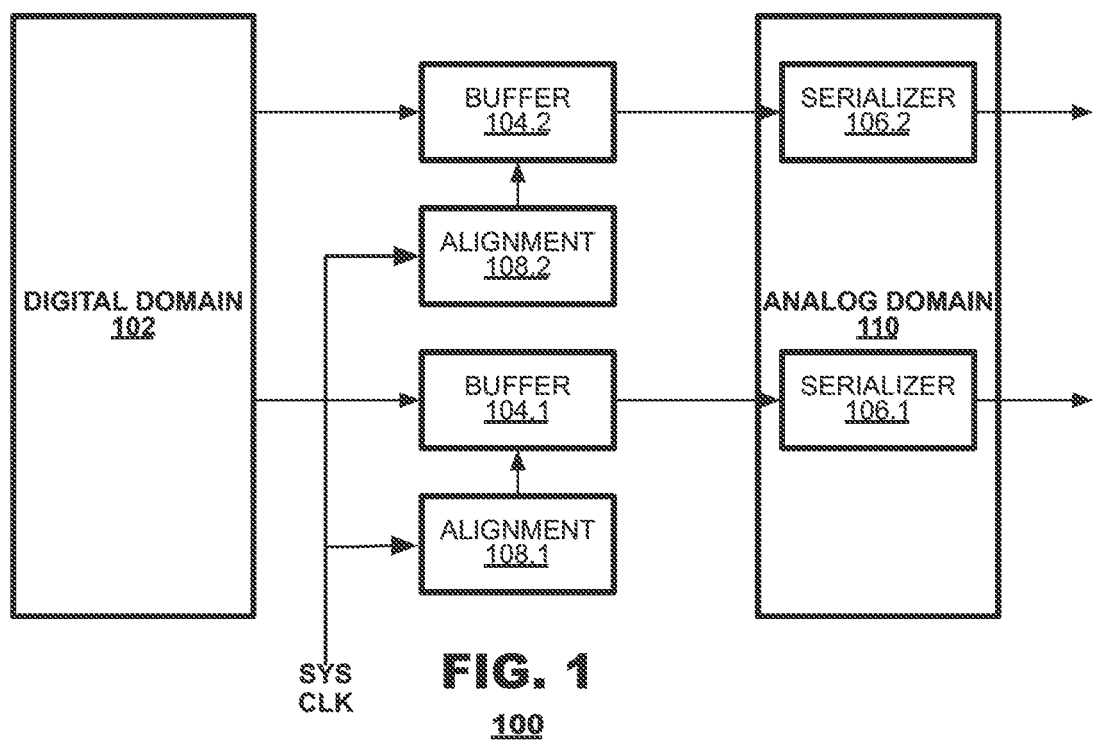
FIG. 1 is a simplified block diagram of a system according to an embodiment of the present invention.

FIG. 1 is a simplified block diagram of a system 100 according to an embodiment of the present invention. The system 100 may include a digital circuit domain 102, an analog circuit domain 110, a pair of buffers 104.1 and 104.2 between the digital domain 102 and the analog domain 110, and a pair of alignment circuit blocks 108.1 and 108.2. The analog domain 110 may comprise a pair of serializers 106.1 and 106.2. The system 100 may be manufactured on a common integrated circuit.

The digital circuit domain 102 may include digital circuitry (not shown) that processes digitized data. The processed digital data stream may be sent to the buffers 104.1 and 104.2. The analog domain 110 may include serializers 106.1 and 106.2 that read data from the buffer 104.1 and 104.2 and send the data bits out in serial lanes. The alignment circuit blocks 108.1 and 108.2 may generate control signals for the buffers 104.1 and 104.2 to initiate reading and writing of data from these buffers 104.1 and 104.2 using locally-generated read and write clocks (not shown). In an embodiment, the alignment circuits 108.1, 108.2 may generate local read and write clocks whose frequencies differ by a rational ratio (M/N, where M and N both are integers) and whose operation is synchronized with each other.

In one embodiment, the digital domain 102 may process digitized data in multiple channels in parallel. Each buffer 104.1 and 104.2 may receive data bits from one or more channels respectively. Thus, each serializer 106.1 and 106.2 may transmit data for one or more digital data channels. In one or more embodiments, the serializers 106.1 and 106.2 may be double data rate (DDR) serializers. That is, the serial bit rate may be double the rate of the clock provided to the serializer. As an example, FIG. 1 illustrates a system 100 having two serializers but other embodiments may have more than two serializers to transmit data in more serial lanes (e.g., four serializers for four lanes).

In one or more embodiments, the alignment blocks 108.1 and 108.2 may be triggered by a common phase locked loop (PLL) (not shown) that provides a system clock SYS CLK. Thus, the alignment blocks 108.1 and 108.2 may generate consistent reset signals for the buffers 104.1 and 104.2. By resetting the buffers 104.1 and 104.2 in a consistent way, the variation in the latency through the buffers 104.1 and 104.2 may be small (e.g., 0.2 write clock periods). Since all FIFOs have almost the same latency, the overall latency for all the lanes will be small (e.g., within 0.2 write clock periods of each other).

Further, in other embodiments, alignment between lanes on two or more ICs may be controlled using the alignment blocks associated with the buffers on each IC chip. Since all the digital blocks have constant latency and the buffers between the digital domain and analog domain on all ICs will have very low variation in latency, the overall variation latency is again controlled to a small amount (e.g., 0.2 write clock periods).

Figure 2:
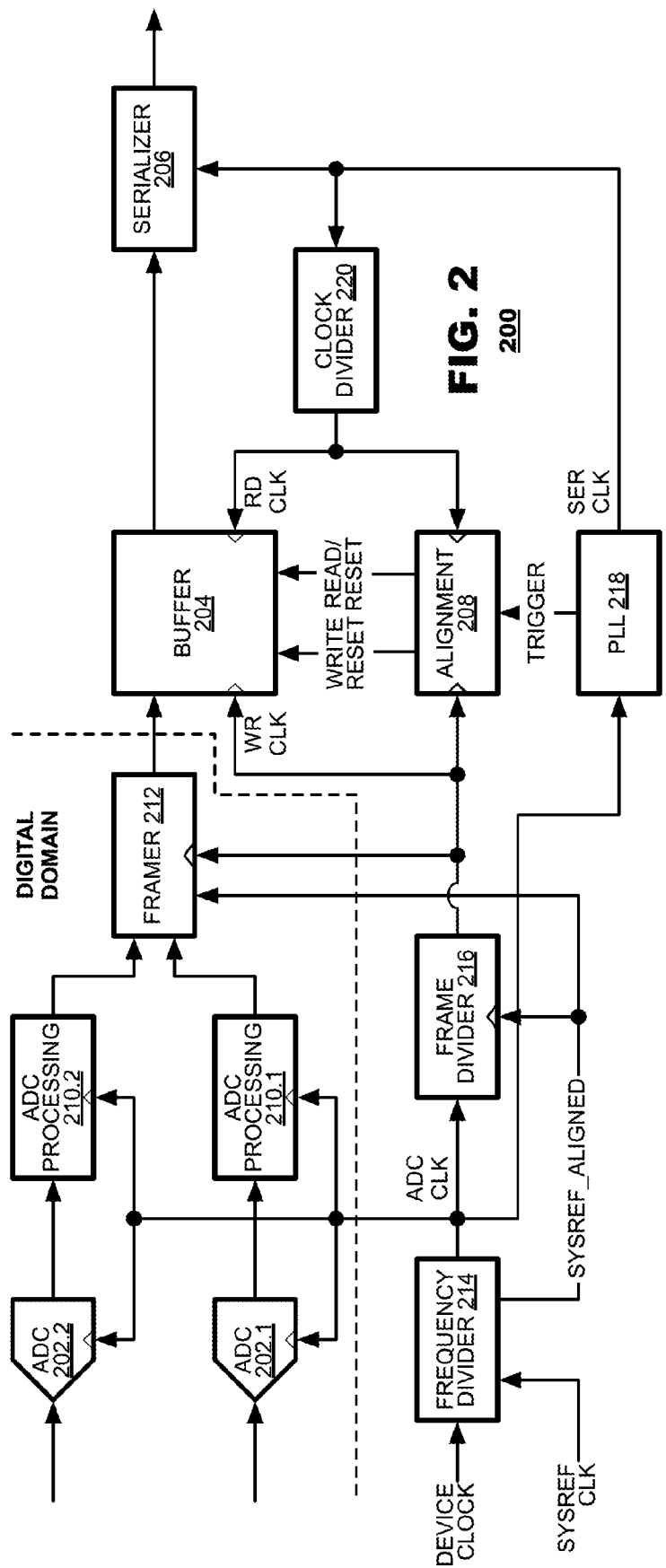
FIG. 2 illustrates an exemplary ADC IC chip in detail according to an embodiment of the present invention.

FIG. 2 illustrates an exemplary ADC IC chip 200 in detail according to an embodiment of the present invention. The ADC IC chip 200 may comprise a pair of ADCs 202.1 and 202.2, a pair of ADC processing blocks 210.1 and 210.2 and a framer 212. The ADCs 202.1 and 202.2, the ADC processing blocks 210.1 and 210.2 and the framer 212 may represent components of a digital circuit domain as in FIG. 1. The ADCs 202.1 and 202.2 may perform analog-to-digital (A/D) conversion of respective input signals (not shown) and may send digital data to respective ADC processing blocks 210.1 and 210.2. The ADC processing blocks 210.1 and 210.2 may perform operations on the digitized data, such as trimming. Then the data stream may be sent to the framer 212, which may encode the digitized data according to encoding schemes.

The ADC IC chip 200 may further comprise a buffer 204 and a serializer 206. The buffer 204 may store the encoded data bits received from the framer 212 and forward them to the serializer 206. The buffer 204 may have a plurality of entries (not shown) that are indexed by a write pointer and read pointer respectively. The buffer 204 may have data written to it and read from it at a consistent data rate. Write operations to the buffer 204, however, may occur at a speed determined by a write clock using data words of a first bit width. Read operations from the buffer 204 may occur at a speed determined by a read clock (RD CLK), which has a different frequency than the write clock, using data words of a second bit width. In one example, write operations to the buffer 204 may occur at 40 bits per write clock and read operations from the buffer 204 may occur at 32 bits per read clock. The read clock may operate at higher frequency than the write clock; the read clock frequency may be 5/4 times (1.25×) faster than the write clock frequency.

Buffer write operations and read operations may be managed by write pointers and read pointers respectively (not shown). The write pointer may identify a next buffer entry to have data written to it and, once data is written to the buffer entry, the write pointer may be incremented to point to the next buffer entry. Similarly, the read buffer may identify a next buffer entry to have data read from it and, once data is read from the buffer entry, the read pointer may be incremented to point to the next buffer entry. The write pointer and read pointer may be reset respectively by assertion of a WRITE_RESET input and a READ_RESET input of the buffer 204.

The serializer 206 may transmit data bits for two channels (from ADCs 202.1 and 202.2 respectively) on one serial lane.

The ADC IC chip 200 may also comprise a frequency divider 214, a frame divider 216, an alignment block 208, a PLL 218 and a clock divider 220. The frequency divider 214 may have two inputs coupled to a device clock and a SYSREF CLK clock signal respectively. The frequency divider 214 may generate an internal ADC clock for the ADCs 202.1 and 202.2, ADC processing blocks 210.1 and 210.2, frame divider 216 and the PLL 218. The frequency divider 214 may generate a SYSREF_ALIGNED signal to the frame divider 216 and the framer 212, which may indicate when the SYSREF signal is aligned with the ADC clock. In one embodiment, the SYSREF CLK signal may act as a timing reference for the frequency divider 214, and the SYSREF_ALIGNED may act as a timing reference for the frame divider 216 and framer 212. In one or more embodiments, the SYSREF CLK may be used to align framers 212 and framer dividers 216 between two or more ICs.

The PLL 218 may generate a serial clock (SER CLK) to drive the serializer 206. The serial clock may be divided down at the clock divider 220 to generate the read clock for the buffer 204. The division factor may be dependent upon the type of the serializer and number of bits to be read from the buffer 204 in one read clock. For example, if 32 bits are read from the buffer 204 in one read clock and the serializer 206 is a DDR serializer (e.g., two bits to be transmitted by the serializer per serial clock), the division factor may be 16. In one or more embodiments, the clock divider 220 may be formed by divider circuits. For example, for a division factor of 16, the clock divider 220 may include two or more division stages (e.g., two stages of divide by 2 and 8, two stages of divide by 4 and 4, three stages of 2, 2 and 4, and other combinations).

The frame divider 216 may generate a clock signal to the framer 212 and the buffer 204 from the ADC clock and the SYSREF_ALIGNED signal. In one embodiment, the framer 212 may use an 8b10b encoding scheme that converts an 8-bit value output from the ADCs 202.1, 202.2 into a 10-bit code. Each 10-bit code may be referred to as an "octet" and thus, may represent 8 bits of data. The frame divider clock WR CLK may have a speed that is based on the number channels being placed on a common lane and also the number of octets that the framer 212 will process per clock period. For example, the framer 212 may be capable of generating 4 octets and 16 bits (so 2 octets) per sample. In this example, the framer 212 may run at half the ADC clock rate when handling one channel per lane and at the ADC clock rate when placing both channels on 1 lane. The frame divider clock also may be input to the buffer 204 as the write clock. If 4 channels were being placed on a common lane, and the framer 212 handles 4 octets per sample, then the framer clock may be twice the speed of the ADC clock. In this latter example, frame divider 216 would include a clock doubler or PLL.

The framer 212 can handle 4 octets per frame clock and, therefore, it may handle 2 16-bit samples per clock period. The number of octets produced by the framer 212 may be controlled by a configurable parameter set in the framer divider 216. If there is only one channel, the framer clock may provided as a divider (divide by 2), since a framer clock period would be equal to 2 samples. However, if there are two channels to one lane, as shown in FIG. 2, then the framer gets one sample from each ADC at the same time, so it may have its clock run twice as fast as the ADC CLK (so a divider would not be necessary). Therefore, the frame divider setting of 1 may mean 4 octets per ADC sample period and the frame divider setting of 2 may mean 2 octets per ADC sample period. The embodiment shown in FIG. 2 may set the configurable parameter to 1 because there are two ADCs (the ADCs 202.1 and 202.2) generating digital data bits for the framer 212.

As indicated, the framer 212 may input data to the buffer 204 at a first rate (e.g., N*10 bits/clk1, N being an integer equal or larger than one, clk1 being a write clock) and the serializer 206 may drain data at a different rate (e.g., $2^k$ bits/clk2, k being an integer equal or larger than one, clk2 being a read clock). Thus, the buffer 204 may operate on a read frequency different from its write frequency (WR CLK≠RD CLK). In one embodiment, each ADC 202.1 and 202.2 may generate 16-bit data for a respective channel for one ADC clock and the framer 212 may generate 40 bits for the two channels in one framer clock. The buffer 204 may have a 40-bit input and a 32-bit output. That is, forty (40) bits of data may be received by the buffer 204 for each cycle of the write clock and thirty-two (32) bits of data may be read out on each cycle of the read clock. Thus, the read/write frequency ratio may be 5/4, meaning the read clock frequency may be 5/4 times faster than the write clock frequency.

The read and write clocks have different frequencies and the timing difference between an edge on one clock and the nearest edge on the other clock may vary in a periodic manner. For the buffer 204 with 40-bit input and 32-bit output, the period of this cycle may be equal to 4 write clock periods (5 read clock periods). If the read and write clock periods were equal, but the phase was asynchronous, then the worst case timing difference between the read and write clock would be equal to one clock period of their common clock. That is, in the worst case, the read operation may be one clock period of the common clock behind the write operation. But when the read and write clock frequencies have a rational ratio, then the relative phase relations between two closest read and write edges changes periodically, and thus, even in the worst case, the phase difference between a read clock and a closest write clock may be just a fraction of the read clock period or the write clock period. For example, for the read/write clock frequencies ratio is 5/4, the closest read and write edges may be 0.25 read clock or 0.2 write clock away in the worst case.

In one embodiment, the alignment block 208 may perform an alignment operation to sample the read and write clocks and generate two synchronous reset signals (e.g., read and write) when the read and write clocks are synced (e.g., at their closest edges). The alignment block 208 may be controlled by a trigger signal from the PLL 218 to start the alignment operation. PLL 218 may generate the trigger signal once it is stable (e.g., during a start up of the chip). In this manner, the trigger signal may be generated when the serial clock and hence the read clock may be stable.

In one embodiment, to ensure that data is written to the buffer 204 before a read occurs, the buffer 204 may start producing data after the first 2 read clocks.

Figure 3:
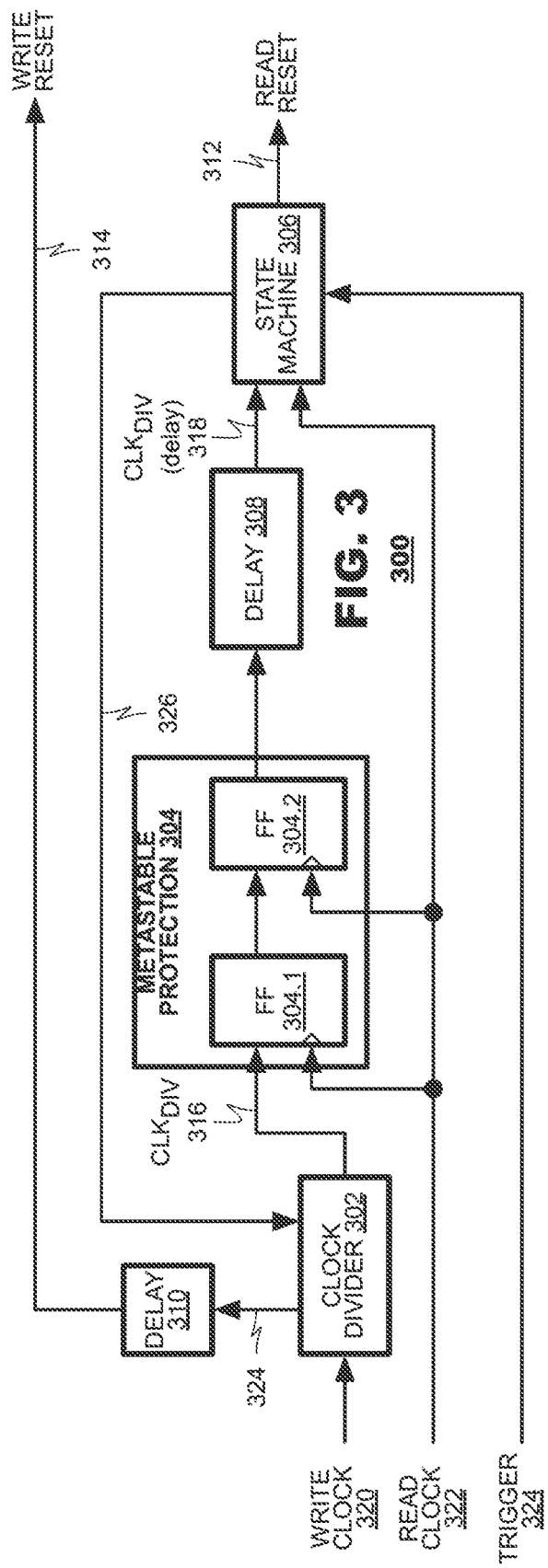
FIG. 3 shows a block diagram of an alignment circuit according to an embodiment of the present invention.

FIG. 3 shows a block diagram of an alignment circuit 300 according to an embodiment of the present invention. The alignment circuit 300 may include a clock divider 302, a metastable protection block 304, a state machine 306 and a pair of delay blocks 308, 310. The alignment circuit 300 may assert a pair of outputs, READ_RESET 312 and WRITE_RESET 314, synchronously to indicate when edges of the read clock and the write clock are aligned.

The clock divider 302 may receive the write clock and may generate an output clock signal 316 having a frequency X times lower than the frequency of the write clock (divide by X). The divided down clock ($CLK_{DIV}$) 316 may be input to the metastable protection block 304. An output of the metastable protection circuit 304 may be input to the first delay unit 308, whose output 318 may be input to the state machine 306. The second delay block 310 may be coupled to an output of the clock divider 302 to delay the write reset signal 314 generated by the clock divider 302.

As described above, when the read and write clock frequencies have a rational ratio, the relative phase relations between two closest read and write edges may change periodically. In one embodiment, in order to find the read clock edge that is closest to the rising edge of the write clock 320, a divided down version 316 of the write clock may be generated at the clock divider 302. This divided clock 316 may be protected by the metastable protection block 304, delayed by the delay block 308, and then sampled at the state machine 306 by the read clock 322.

In one embodiment, the metastable protection block 304 may include a pair of flip flops 304.1, 304.2 and may cause a delay. The total delay along the metastable protection block 304 and the first delay block 308 may be equal to one cycle of the phase shifting between the read and write clocks. For example, if the read/write frequencies ratio is 5/4, this total delay may be set to equal to 4 write clocks (5 read clocks). Thus, the total delay along the metastable protection block 304 and the first delay block 308 may be ignored because it does not introduce any phase mismatch (equivalent to sampling instantly). In other words, the $CLK_{DIV}$ signal 316 has a common timing relationship to the read clock 320 and write clock 322 as the delayed $CLK_{DIV}$ signal 318 and, therefore, they function as a common clock signal.

In one or more embodiments, the alignment system 300 may perform an alignment operation that may have a coarse alignment stage followed by a fine alignment stage. The coarse alignment stage and fine alignment stage may also be referred to as a coarse alignment mode and a fine alignment mode. The alignment operation may be triggered by a trigger signal 324, which may function as a reset for the state machine 306. In one embodiment, the reset is not necessarily synchronous with either the read or write clock. For example, the reset may come from a PLL, from an SPI trigger (so synchronous with the SPI clock) or from a delay counter based on the ADC clock (which is itself reset by the PLL). That is, the reset may have metastable protection.

During the alignment operation, the delayed divided down clock signal 318 may be sampled at the state machine 306. Once aligned read and write clock edges have been found, synchronous reset signals (e.g., write and read resets) 312, 314 may be generated for both the write and read clocks that marks the aligned clock edges. In one embodiment, the read reset 312 may be generated directly by the state machine 306. For the write reset 314, the state machine 306 may send a write reset notify signal 326 to the clock divider 302. The write reset notify signal 326 may be timed to change on the falling edge of the divided down clock 316/318. A write reset 324 may be generated on the next positive edge of the divided down clock 316/318. This write reset signal 324 may be delayed at the second delay block 310 to make sure the write reset signal 314 that is output from the alignment system 300 is synced with the read reset signal 312.

Figure 4:
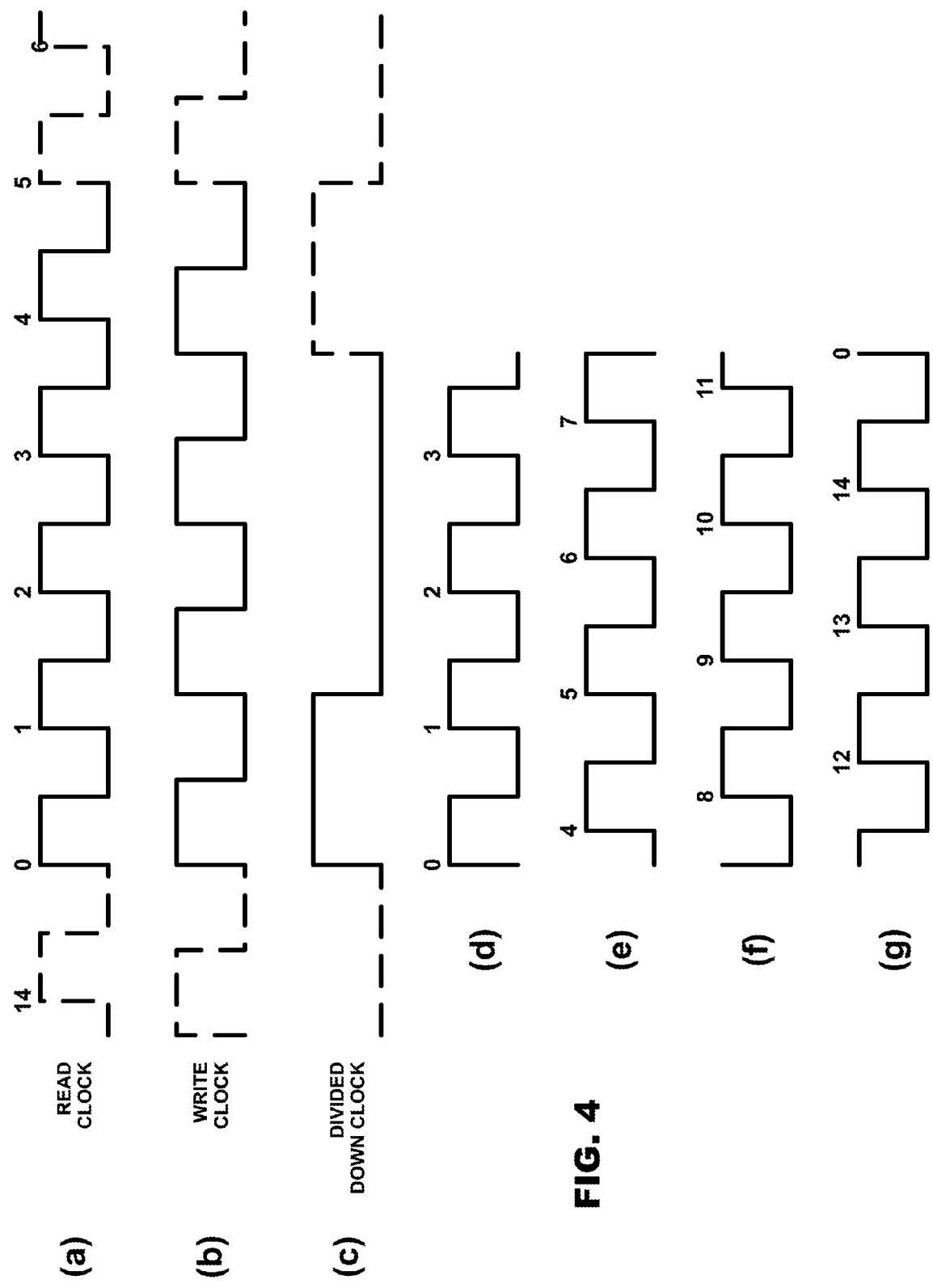
FIG. 4 illustrates exemplary clock signals at work in an alignment system as shown in FIG. 3.

FIG. 4 illustrates exemplary clock signals at work in an alignment system as shown in FIG. 3. FIGS. 4(a)-(c) illustrate relationships among the read clock, the write clock and the divided clock respectively. In the illustrated example, assuming the read/write frequencies ratio is 5/4, the clock divider may operate as divide by 3 (X=3). As a consequence, the read clock, the write clock and the divided clock may become edge aligned once in every 15 (3*4*5=15) cycles of the read clock.

In the example of FIG. 4, the divided down clock need not have a 50-50 duty cycle. Instead, the divided down clock may have an asymmetric duty cycle in which the clock that has a mark (logical "1") for one write clock cycle and a space (logical "0") for two write clock cycles. The divided down clock may be sampled at the read clock by 2 flip flops in series to provide metastable protection (e.g., at the metastable protection block 304 of FIG. 3). Other embodiments find application with divided down clocks having a 50/50 mark-space ratio.

FIGS. 4(d)-(g) illustrate relationships between the read clock edges and the divided down clock edges. As illustrated in FIG. 4(d), a rising edge of the read clock is aligned with a rising edge of the divided down clock on a cycle "0" of the read clock. The next rising edge of the divided down clock may occur shortly before a cycle "4" of the read clock, shown in FIG. 4(e). Thereafter, another rising edge of the divided down clock may occur a half-cycle before a cycle "8" of the read clock. A fourth rising edge of the divided down clock may occur prior to a cycle "12" of the read clock. The fifth rising edge of the divided down clock may be aligned with a 15th read clock cycle following cycle 0, which is labeled cycle "0" as well.

Phase relationships between the write clock and read clock of FIG. 4 may be shown in Table 1 below. The phase shifts of the nearest write clock may be given in write clock periods.

TABLE 1

| READ CLOCK | DISTANCE TO NEAREST RISING EDGE OF WRITE CLOCK |
|---|---|
| 0 | 0 |
| 1 | 0.2 |
| 2 | 0.4 |
| 3 | −0.4 |
| 4 | −0.2 |
| 5 | 0 |
| 6 | 0.2 |
| 7 | 0.4 |
| 8 | −0.4 |
| 9 | −0.2 |
| 10 | 0 |
| 11 | 0.2 |
| 12 | 0.4 |
| 13 | −0.4 |
| 14 | −0.2 |

For example, at read clock 1, the nearest rising edge of the write clock is 0.2 write clock periods in the future (later in time) whereas, for read clock 9, the nearest rising edge is 0.2 write clock periods in the past (earlier in time). This pattern repeats every 15 clock periods.

As shown in Table 1, for each read clock period, the nearest positive edge of the write clocks shift by 0.2 of a write clock (0.25 of a read clock). Also, the phase relationship between edges repeats every 5 read clock periods.

The phase relationship between the read clock and the divide by 3 clock may be shown in Table 2 below, again, measured in write clock periods.

TABLE 2

| READ CLOCK | DISTANCE TO NEXT RISING EDGE OF DIVIDED CLOCK |
|---|---|
| 0 | 0 |
| 1 | 2.2 |
| 2 | 1.4 |
| 3 | 0.6 |
| 4 | 2.8 |
| 5 | 2.0 |
| 6 | 1.2 |
| 7 | 0.4 |
| 8 | 2.6 |
| 9 | 1.8 |
| 10 | 1.0 |
| 11 | 0.2 |
| 12 | 2.4 |
| 13 | 1.6 |
| 14 | 0.8 |

As shown in Table 2, the alignment between the divide by 3 clock and the read clock may repeat every 15 read clock periods. In particular, a delay of 1 read clock may shift the phase difference by 0.8 write clock period and a delay of 4 read clock periods may shift the phase difference by 0.2 write clock period. Thus, to align the read and write clocks, a coarse alignment may be carried out with steps of one read clock period and a fine alignment stage may be carried out with steps of 4 read clock periods.

FIG. 4 illustrates a divided down clock generated by a divide by X where X=3. In implementation, other values of X may be selected so long as the divided down clock is high for at least one read clock cycle and also low for at least one clock cycle.

Figure 5:
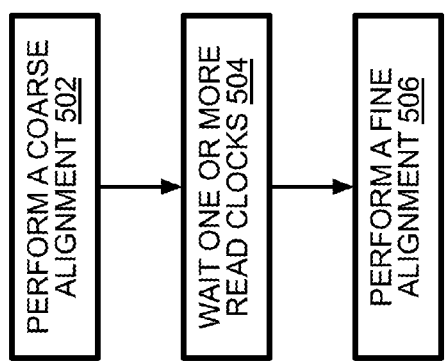
FIG. 5 illustrates a method of aligning clock signals according to an embodiment of the present invention.
Figure 6:
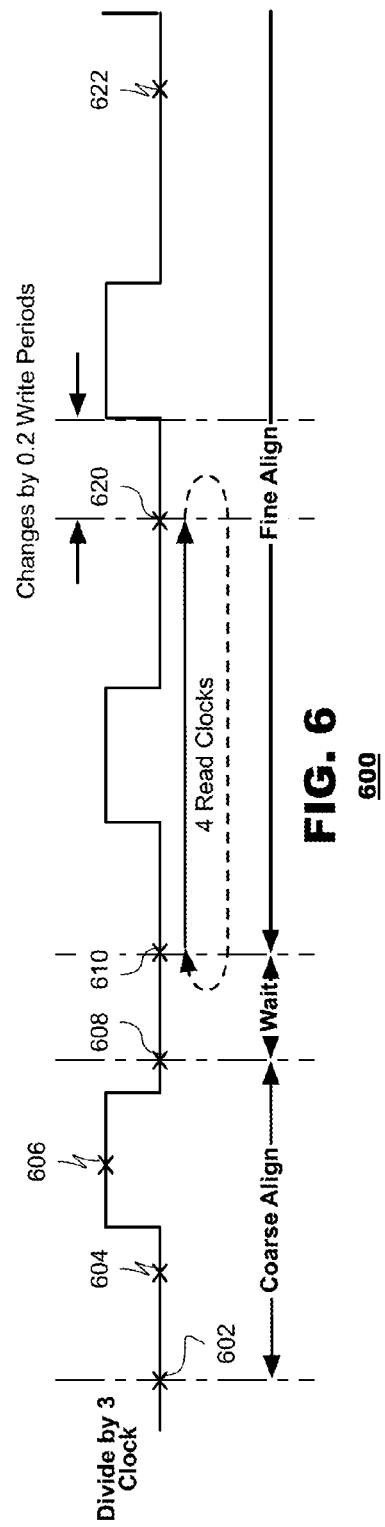
FIG. 6 is an exemplary clock diagram illustrating operation of the method of FIG. 5.

FIG. 5 illustrates a method 500 of aligning clock signals according to an embodiment of the present invention. FIG. 6 is an exemplary clock diagram illustrating operation of the method 500 of FIG. 5. The embodiment shown in FIG. 5 may be an alignment operation performed by the alignment circuit 300 for the read/write frequencies ratio of 5/4 and using a divide by 3 clock (e.g., N=3 for the clock divider 302).

At block 502, a coarse alignment may be performed. As described above, a trigger signal may be generated at a PLL when the PLL stabilizes. During the coarse alignment stage, the divide by 3 clock may be sampled at the state machine 306 at each read clock (e.g., positive edge of each read clock) until a falling edge (1→0) is detected. That is, the coarse alignment may be performed at steps of 1 read clock period (or 0.8 write clock periods), until a negative edge of a divide by 3 clock may be detected. The detection of the logic low may mean a falling edge has occurred during the last read clock period.

Once the coarse alignment stage is completed, the read clock edge may be at most one read clock period after the falling edge of the divide by 3 clock. The rising edge of the divide by 3 clock may occur two write clock periods after the falling edge, which is equal to 2*(5/4) read clock periods. Thus, the next positive edge of the divide by 3 clock is guaranteed to be at least 10/4−1=1.5 read periods in the future. Therefore, at block 504, in one embodiment, the state machine may wait 1 read clock period before switching to the fine alignment stage.

After the wait, at block 506, a fine alignment stage may be performed. During the fine alignment stage, the state machine 306 may test the divide by 3 clock every 4th read clock. The clock period of the divide by 3 clock may be equal to 15/4 read clock periods. Stepping in 4 read clock periods may be equivalent to stepping for one quarter of one read clock period plus one divide by 3 clock period (0.25 read clock period+one divide by 3 clock period). Thus, after each four read clock periods, the phase of the divide by 3 clock may shift by one quarter of one read clock period, which is 0.2 write clock period. The fine alignment stage may continue until the state machine detects a value of one when testing the value of the divide by 3 clock.

Since the phase of the divide by 3 clock is shifting by one quarter of one read clock period between each test of the fine alignment stage, when the value of one is detected, the positive edge of the divide by 3 clock may have occurred within one quarter of a read clock period.

Once the state machine 306 detects a value of one during the fine alignment stage, the state machine 306 may send a write reset notify signal to the clock divider 302. This signal may be timed to be asserted on the falling edge of the divide by 3 clock and may be observed on the positive edge of the divide by 3 clock. By changing the write reset notify signal near the falling edge and observing it near the rising edge, the signal may be read safely. By the time the write reset notify signal is sent, the alignment process may be complete, so the state machine 306 knows which read clock edge may be near the falling edge of the divide by 3 clock.

After the write reset notify signal is asserted, reset signals may be generated for both clock domains. In one embodiment, the write reset may be asserted by a write clock division circuit on the next positive edge of the divide by 3 clock (synced with the write clock) and the read reset may be asserted by a state machine on the matching read clock edge (synced with the read clock). In one or more embodiments, the write reset notify signal may be de-asserted on a next falling edge of divide by 3 clocks.

In one embodiment, the reset for the read clock may be generated five read clock periods later. That is the period at which the phase relationships repeat, so waiting 5 periods from when the 2 edges were aligned gives the aligned phase relationship.

The write reset notify signal may be sent to the clock divider 302 two read clock periods later. This may align the write reset notify signal with the falling edge of the divide by 3 clock because 2 read clock periods after the rising edge of the divide by 3 clock may be roughly aligned with the falling edge of the divide by 3 clock.

As describe above, the write reset notify signal may transition on the negative edge of the divide by 3 clock. When the clock divider 302 detects this signal, it may generate a write reset on the next positive edge of the divide by 3 clock. As shown in FIG. 3, the write reset signal may be delayed (e.g., the delay block 310) before being sent out.

Figure 7:
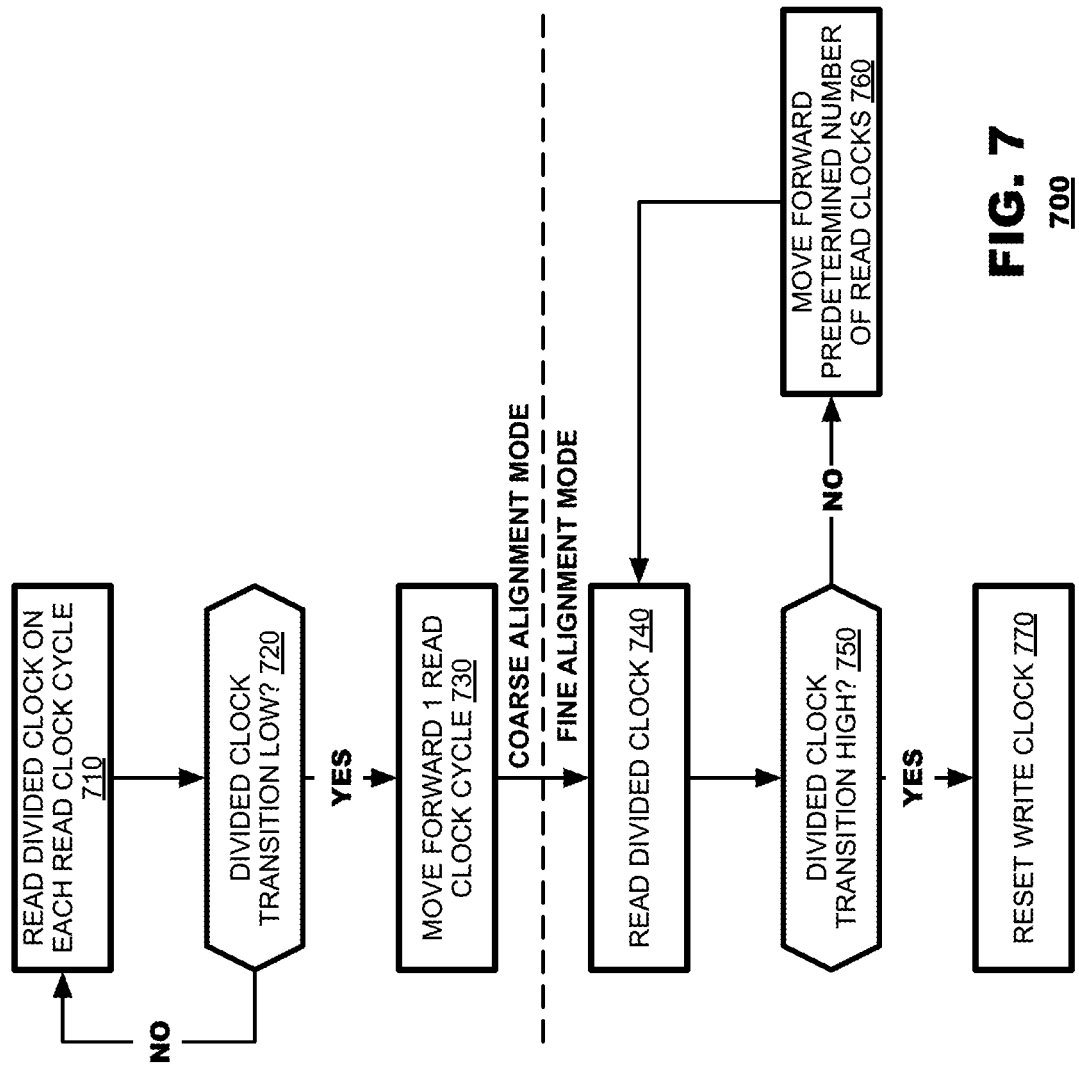
FIG. 7 illustrates a method to synchronize read clocks and write clocks according to an embodiment of the present invention.

FIG. 7 illustrates a method 700 to synchronize read clocks and write clocks according to an embodiment of the present invention. The method may find application in system in which the read clock operates at a frequency M/N times faster than the write clock. The method 700 may begin by reading the divided clock on each read clock cycle until the divided clock transitions high (boxes 710-720). When the clock transitions high, the method 700 may wait a read clock cycle (box 730) and then may read the divided clock (box 740). The method 700 may determine whether the divided clock transitioned high (box 750). If not, the method may wait a predetermined number of read clocks (box 760) and may return to box 740 for another iteration. If so, the method 700 may reset the write clock (box 770). The read clock and write clock will be in alignment.

As shown above, in box 760, the method 700 waits a predetermined number of read clocks when searching for clock transitions in box 750. The number of read clock cycles may vary in implementation based on the ratio of write clocks to read clocks (M/N) and the division factor X used to generate the divided down clock X. A delay of D read clocks may induce a phase shift between the read clock and write clock given by [(D*N) mod (M*X)]/N. With M=5, N=4 and X=3, that gives D=1:[(1*4) mod 15]/4=4/4=1
D=2:[(2*4) mod 15]/4=8/4=2
D=3:[(3*4) mod 15]/4=12/4=3
D=4:[(4*4) mod 15]/4=1/4=0.25
D=5:[(5*4) mod 15]/4=5/4=1.25

A delay of four clock cycles may be selected because it gives fine control over phase shifts. In other implementations, with other values of M, N and X and other phase shift patterns, the wait length may be different.

The system and the method disclosed here are simple to implement and provides a fine resolution to alignment of the read and write clocks to a buffer.

As shown above, skew between lanes of an ADC chip can be controlled by an alignment circuits that manage alignment between read and write clocks to an output buffer. Sub-sample resolution may be achieved by exploiting the rational frequency relationship between the read and write clocks. When the read and write clocks have a ratio of 5/4, fine resolution of 0.2 write clock cycles can be achieved. The alignment circuits may selecting a number of read clock periods to wait between measurements to give optimal phase shifting for fine and coarse stages of operation. In other embodiments, positive and negative edges of the read and write clocks may be exploited to improve a resolution by a factor of two. The phase shift tables (Tables 1 and 2) may be expanded to include positive and negative edge sampling.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. A method of aligning a pair of clock signals whose frequencies differ by a factor M/N, where M and N are integers, comprising:
    dividing a first clock signal by a predetermined factor to generate a divided down clock,
    on each cycle of the second clock, determine whether a transition of the divided down clock has occurred,
    when a transition of the divided down clock is detected, reading the divided down clock on a predetermined transition of the second clock,
    determining whether another transition of the divided down clock has occurred on the predetermined transition, and
    if not, repeating the reading and determining until a transition of the divided down clock is detected,
    wherein, the first and second clock signals are determined to be aligned when a transition of the divided down clock is detected on the predetermined transition of the first clock.

2. The method of claim 1, wherein the first clock signal is a write signal to a buffer memory and the second clock signal is a read signal from the buffer memory.

3. The method of claim 1, wherein the first and second clocks both are derived within an integrated circuit from a common clock source provided to the integrated circuit.

4. The method of claim 1, further comprising performing a second instance of the method in an integrated circuit separate from an integrated circuit which a first instance of the method is performed, wherein the first and second clocks of both integrated circuits are derived from a common clock source.

5. The method of claim 1, wherein the predetermined transition is based on a number of phase shift patterns that occur between the read clock and the divided down clock.

6. The method of claim 1, wherein the divided down clock is high for at least one read clock cycle and low for at least one read clock cycle.

7. An integrated circuit comprising:
    a digital circuit domain having circuitry to generate digital data,
    a buffer circuit having a write input for the digital data, a read output, a write clock input defining timing of write operations to the buffer circuit and a read clock input defining timing of read operations from the buffer circuit,
    an output circuit having an input coupled to the read output, and
    a clock system generating a write clock and a read clock to the buffer, whose frequencies differ by a factor M/N where M and N are integers, the clock system including an alignment system that detects alignment between edges of the write clock and read clock based on a divided down clock derived from the write clock.

8. The integrated circuit of claim 7, wherein the alignment circuit resets a write pointer to the buffer when the write clock is edge-aligned with the read clock.

9. The integrated circuit of claim 7, wherein the alignment circuit resets a read pointer to the buffer when the write clock is edge-aligned with the read clock.

10. The integrated circuit of claim 7, wherein the digital circuit domain comprises an analog-to-digital converter.

11. The integrated circuit of claim 7, wherein the clock system comprises a frequency divider having an input coupled to an externally-supplied clock, and a frame divider having an input coupled to an output of the frequency divider.

12. The integrated circuit of claim 11, wherein the clock system further comprises a PLL having an input coupled to the output of the frequency divider.

13. The integrated circuit of claim 7, wherein the output circuit comprises a serializer.

14. The integrated circuit of claim 7, the divided down clock is high for at least one read clock cycle and low for at least one read clock cycle.

15. An ADC system, comprising:
- a plurality of ADCs to digitize respective input signals in response to an ADC clock,
- a framer circuit having inputs coupled to outputs of the ADCs,
- a buffer memory having
  - a write port coupled to an output of the framer circuit,
  - a write clock input for a write clock having a frequency of M,
  - a read port coupled to output circuitry, and
  - a read clock input for a read clock having a frequency of N; and
- an alignment circuit, having inputs for the write clock and the read clock to detect alignment between edges of the write clock and read clock and to reset read and write pointers to the buffer when the edges are aligned.

16. The system of claim 15, wherein the clock system comprises a clock divider having an input coupled to the write clock, and a frame divider having an input coupled to an output of the frequency divider.

17. The system of claim 15, wherein the clock system comprises:
- a clock divider, having a division factor X,
- a pair of cascaded flip-flops, a first flip flop coupled to the clock divider,
- a first delay unit coupled to a second flip flop,
- a state machine to compare an output of the first delay unit to the read clock, and
- a second delay unit having an input coupled to an output of the clock divider.

18. The system of claim 15, further comprising a serializer having an input coupled to the read port.

19. An integrated circuit comprising:
- a digital circuit domain having circuitry to generate digital data,
- a buffer circuit having a write input for the digital data, a read output, a write clock input defining timing of write operations to the buffer circuit and a read clock input defining timing of read operations from the buffer circuit,
- an output circuit having an input coupled to the read output, and
- a clock system generating a write clock and a read clock to the buffer, whose frequencies differ by a factor M/N where M and N are integers, the clock system including an alignment system that detects alignment between edges of the write clock and read clock based on a divided down clock.

20. The integrated circuit of claim 19, wherein the divided down clock is derived from the read clock.

* * * * *